(12) United States Patent
Narahara et al.

(10) Patent No.: US 10,152,007 B2
(45) Date of Patent: Dec. 11, 2018

(54) FIXING MEMBER, FIXING DEVICE HAVING FIXING MEMBER, AND METHOD OF MANUFACTURING FIXING MEMBER HAVING OVERLAPPING HEAT GENERATING STRIPS

(71) Applicant: CANON KABUSHIKI KAISHA, Tokyo (JP)

(72) Inventors: Takashi Narahara, Mishima (JP); Takeshi Shinji, Yokohama (JP); Kazuhiro Doda, Yokohama (JP); Yutaka Sato, Komae (JP); Kohei Wakatsu, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/606,198

(22) Filed: May 26, 2017

(65) Prior Publication Data

US 2017/0343929 A1 Nov. 30, 2017

(30) Foreign Application Priority Data

May 27, 2016 (JP) ................................ 2016-106010

(51) Int. Cl.
*G03G 15/20* (2006.01)
*C23C 16/56* (2006.01)

(52) U.S. Cl.
CPC ........... *G03G 15/206* (2013.01); *C23C 16/56* (2013.01)

(58) Field of Classification Search
CPC ............................ G03G 15/206; C23C 16/56
See application file for complete search history.

(56) References Cited

U.S. PATENT DOCUMENTS

| 4,628,183 | A  | * | 12/1986 | Satomura ........... G03G 15/2053 |
|           |    |   |         | 219/216                          |
| 6,865,362 | B2 | * | 3/2005  | Otsuka ................. H05B 3/0095 |
|           |    |   |         | 399/329                          |
| 9,182,713 | B2 |   | 11/2015 | Narahara et al.                  |
| 9,229,388 | B2 |   | 1/2016  | Imaizumi et al.                  |
| 9,235,172 | B2 |   | 1/2016  | Imaizumi et al.                  |
| 9,417,576 | B2 |   | 8/2016  | Minamishima et al.               |
| 9,423,737 | B2 |   | 8/2016  | Narahara et al.                  |
| 9,507,303 | B2 |   | 11/2016 | Imaizumi et al.                  |
| 9,513,586 | B2 |   | 12/2016 | Narahara et al.                  |

(Continued)

FOREIGN PATENT DOCUMENTS

| JP | H08-272244 A  | 10/1996 |
|----|---------------|---------|
| JP | 2011-253141 A | 12/2011 |
| JP | 2013-097315 A | 5/2013  |

*Primary Examiner* — Francis C Gray
(74) *Attorney, Agent, or Firm* — Fitzpatrick, Cella, Harper & Scinto

(57) ABSTRACT

A fixing member for a fixing device includes a cylindrical base layer, and a plurality of heat generating resistors extending in a longitudinal direction of the fixing member on the base layer and arranged with intervals in a circumferential direction of the base layer. Each of the plurality of heat generating resistors has a volume resistivity less than that of the base layer. The plurality of heat generating resistors includes a first heat generating resistor and a second heat generating resistor adjacent to each other in the circumferential direction, and the first heat generating resistor and the second heat generating resistor are at least partly overlapped in the circumferential direction.

18 Claims, 11 Drawing Sheets

(56) References Cited

U.S. PATENT DOCUMENTS

| | | | |
|---|---|---|---|
| 9,915,897 B2* | 3/2018 | Narahara | G03G 15/2053 |
| 2011/0286775 A1* | 11/2011 | Ishihara | G03G 15/2042 |
| | | | 399/329 |
| 2015/0227091 A1 | 8/2015 | Ando et al. | |
| 2016/0139546 A1 | 5/2016 | Imaizumi et al. | |
| 2016/0342117 A1 | 11/2016 | Minamishima et al. | |
| 2017/0031283 A1 | 2/2017 | Imaizumi et al. | |
| 2017/0060052 A1* | 3/2017 | Narahara | G03G 15/2053 |
| 2017/0315484 A1* | 11/2017 | Shinji | G03G 15/2057 |
| 2017/0343930 A1* | 11/2017 | Nakajima | G03G 15/2039 |

* cited by examiner (a)

(b)

(a)

(b)

(a)

(b)

FIXING MEMBER, FIXING DEVICE HAVING FIXING MEMBER, AND METHOD OF MANUFACTURING FIXING MEMBER HAVING OVERLAPPING HEAT GENERATING STRIPS

This application claims the benefit of Japanese Patent Application No. 2016-106010 filed on May 27, 2016, which is hereby incorporated by reference herein in its entirety.

FIELD OF THE INVENTION AND RELATED ART

The present invention relates to a fixing member, a fixing device having a fixing member, and a method for manufacturing a fixing member. The fixing member may be a rotational heating member, and an image heating device having the rotational heating member is employable by an image forming apparatus, such as a printing machine, a copying machine, and the like.

As an example of image heating device, a fixing device for fixing an unfixed toner image formed on a recording medium, a glossing device for improving a glossiness of a toner image, fixed to a recording medium, by heating the toner image, and the like, can be used.

As a fixing device to be installed in an image forming apparatus, an apparatus having a rotational heating member, such as a roller having an electrically conductive layer, that is supplied with electrical power to generate Joule's heat, being, therefore, shorter in the length of startup time, and also, smaller in energy consumption is known. For example, as disclosed in Japanese Laid-open Patent Application No. 2013-97315, a fixing member, as a rotational heating member, has a heat generation layer made of a compound concocted by dispersing a carbon filler in a heat resistant resin, an electrically insulative elastic layer formed on the heat generation layer, and an electrically insulative release layer formed on the elastic layer. In the case of this fixing device, heat is generated by directly supplying electrical power to the electrically resistant heat generating layer that is a part of the rotational member, in order to reduce the length of time necessary for warm up.

By the way, the electrically insulative layer of a fixing member such as the above-described fixing member, comprising an elastic layer, a release layer, etc., is not sufficient in strength. That is, the electrically insulative layer is easily scarred by the friction that occurs between itself and a recording medium, and/or foreign substances that enter the fixing device from outside the apparatus. These scars possibly reach the electrically resistant heat generating layer. Further, it is possible that a user will scar the electrically resistant heat generating layer with a tweezer, a cutter, or the like. If the electrically resistant heat generating layer is scarred, the portion of the heat generating layer that is adjacent to the scarred portion increases in electrical current density, making it possible that this portion of the heat generating layer will abnormally heat up.

Next, this phenomenon is described in greater detail with reference to a schematic drawing of a fixing device, shown in FIG. 12. The fixing device employs a cylindrical fixation film 1, as a fixing member, that has a heat generating layer formed of an electrically resistant substance. The drawing shows the manner in which the electrical current that flows through the heat generating resistant layer concentrates in the adjacencies of the end portions of a scar, or a crack C, as the crack C develops across a part of the electrically resistant heat generating layer. The lengthwise end portions of the fixation film 1 are provided with a pair of electrically conductive layers 1b that extend in the circumferential direction of the fixation film 1. The fixation film 1 is made to generate heat by placing a pair of power supplying members 3a and 3b in contact with the pair of electrically conductive layers 1b, one for one, to cause electrical current to flow through the fixation film 1 with the use of an alternating current source 10.

A referential code 4 stands for a pressure roller, as a pressure applying rotational member, that is rotationally driven. The pressure roller 4 forms a nip N (fixation nip) in cooperation with the fixation film 1. The fixation film 1 is rotated by the rotation of the pressure roller 4. A sheet P of recording medium, on which an unfixed toner is formed, is introduced into the nip N, and is conveyed through the nip N while remaining pinched by the fixation film 1 and the pressure roller 4. As the sheet P is conveyed through the nip N, the sheet P and the toner image on the sheet P, are heated and pressed. Consequently, the unfixed toner image becomes fixed to the sheet P.

Referential codes I1 to I4 stand for electrical currents that are flowing through the electrically resistant heat generating layer of the fixation film 1. Since the fixation film 1 is provided with the pair of electrically conductive layers 1b, electrical current uniformly flows through the electrically resistant heat generating layer in the lengthwise direction of the fixation film 1, and, therefore, the heat is uniformly generated in the fixation film 1.

As the crack C occurs in the electrically resistant heat generating layer, however, the crack C interferes with the flow of the electrical current I2 and I3, causing the electrical currents I2 and I3 to divert to the adjacencies A and B of the end portions of the crack C. Consequently, the areas A and B are increased in electrical current density, generating, therefore, an abnormally larger amount of heat that, in turn, makes these areas A and B extremely high in temperature compared to the other areas of the electrically resistant heat generating layer, making it possible for the fixation film 1 to suffer from thermal damages and/or for the image forming apparatus to output unsatisfactory images.

As one of the means for preventing the abnormally large amount of heat generation in the electrically resistant heat generating layer, attributable to the occurrence of the above-mentioned crack C in the electrically resistant heat generating layer, it is possible to design the heat generating layer as shown in FIG. 13, showing a referential example of a fixation film 1. That is, it is possible to construct the fixation film 1 so that a preset number of strips 1e of an electrically resistant heat generating substance extend in parallel on a substrative layer 1a of the fixation film 1, with the presence of preset intervals in terms of the circumferential direction of the fixation film 1. The electrically conductive layers 1b and 1b are formed on the lengthwise end portions of the substrative layer 1a, so that the electrically conductive layers 1b and 1b encircle the substrative layer 1a, and also, so that the electrically conductive layers 1b and 1b contact each of the heat generating strips 1e. By constructing the fixation film 1 so that it is provided with multiple heat generating strips 1e that are positioned so that they extend in parallel to the lengthwise direction of the fixation film 1, with the presence of a preset amount of interval between the adjacent two strips 1e, it is possible to prevent the problem in which, as the electrically resistant heat generating layer cracks in the circumferential direction of the fixation film 1, the adjacencies of the lengthwise ends of the cracked fixation film 1 increase in electrical current density due to the electrical current concentration.

The electrically resistant heat generating strips 1e are formed by printing on the cylindrical insulative substrative layer 1a of the fixation film 1. The greater the number of the heat generating strips 1e in terms of the circumferential direction of the fixation film 1, the smaller the amount by which electrical current flows through each heat generating strip 1e, and, therefore, the less likely for electrical current to concentrate to specific portions of the fixation film 1. This solution, however, suffers from the following problem. That is, in a case in which a substantial number of heat generating strips 1e are formed by printing on the substrative layer 1a of the fixation film 1 so that they extend in the lengthwise direction of the fixation film 1, with the presence of the preset amount of interval between two adjacent heat generating strips 1e, the heat generating strips 1e to be printed on the area of the substrative layer 1a that corresponds in position to the printing junction where printing is started and ended are likely to be disturbed during the printing.

Next, this problem is described in greater detail with reference to a case in which the electrically resistant heat generating strips 1e are printed by screen printing, for example. Referring to part (a) of FIG. 14, showing an example of how the electrically resistant heat generating strips 1e are formed by screen printing, while the cylindrically formed substrative layer 1a (substrative layer of the fixation film 1) is rotated on one of the surfaces of a screen 8, so that the substrate layer 1a moves in the direction indicated by an arrow mark in part (a) of FIG. 14, a squeegee 9 supplied with electrically resistant heat generating paste H is moved along the other surface of the screen 8 in the direction indicated by another arrow mark in part (a) of FIG. 14. Thus, the electrically resistant heat generating paste H passes through minute openings M of the screen 8, and forms the preset number of electrically resistant heat generating strips 1e in the preset pattern on the substrative layer 1a. That is, the electrically resistant heat generating strips 1e are printed on the substrative layer 1a.

Part (b) of FIG. 14 is a schematic top view of a combination of the substrative layer 1a and the screen 8 having the pattern for printing the electrically resistant heat generating strips 1e and the pair of electrically conductive layers 1b. The areas 1b' of the screen 8 form the electrically conductive layers 1b, and the areas 1e' of the screen 8 form the electrically resistant heat generating strips 1e. A referential code h1 stands for the heat generating strip (that may be referred to as first heat generating strip) to be printed first by the areas 1e', and a referential code h2 stands for the heat generating strip (that may be referred to as second heat generating strip) to be printed last. Thus, the area h1' of the screen 8 forms the heat generating strip 1h, and the area h2' of the screen 8 forms the electrically resistant heat generating strip h2.

Hereafter, the area of the substrative layer 1a between the area on which the first heat generating strip h1 is formed and the area on which the last heat generating strip h2 is formed, after a full rotation of the substrative layer 1a, and after the formation of the first electrically resistant heat generating strip h1, will be referred to as a "printing junction". If the distance between the first and last electrically resistant heat generating strips h1 and h2, respectively, on the printing junction is small, the first electrically resistant heat generating strip h1, or the heat generating strip printed first, comes into contact with the screen 8. At this stage of the screen printing, the printed heat generating strips 1e have not been sintered, and are, therefore, "wet." Thus, the first electrically resistant heat generating strip h1 comes into contact with the screen 8 while it is "wet". Therefore, parts of the first electrically resistant heat generating strip h1 that is a wet strip of electrically resistant heat generating paste H, adhere to the screen 8. Consequently, the first electrically resistant heat generating strip h1, or the heat generating strip 1e printed first, becomes partially thinner.

The thinned portions of the first electrically resistant heat generating strip h1 are higher in electrical resistance, and, at some points, might become noncontiguous. Therefore, the thinned electrically resistant heat generating layer h1 is smaller in the amount by which electrical current is allowed to flow, being, therefore, smaller in the amount of heat generation, or may be zero in the amount of electrical current flow. Thus, the fixation film 1 manufactured with the use of the above-described method suffers from the problem in that it causes an image forming apparatus to output defective images, the defects of which are repetitive and synchronous in occurrence with the rotational cycle of the fixation film 1.

By the way, in addition to screen printing, various other printing methods, such as flexographic printing and inkjet printing, are usable. As long as multiple electrically resistant heat generating strips 1e are printed in parallel, however, with the presence of a preset interval between the adjacent two strips 1e, on an endless substrative layer 1a, a problem similar to the above-described one will occur.

Thus, the primary object of the present invention that is related to a rotational heating member having a preset number of printed electrically resistant heat generating strips, is to provide a rotational heating member that does not suffer from the problem that a portion of the rotational heating member that corresponds in position to the "printing junction" is insufficient in the amount of heat generation, and therefore, the rotational heating member fails to properly heat, and an image heating fixing device employing the rotational heat generating member.

SUMMARY OF THE INVENTION

According to an aspect, the present invention provides a fixing member for a fixing device, the fixing member comprising a cylindrical base layer, and a plurality of heat generating resistors extending in a longitudinal direction of the fixing member on the base layer, and arranged with intervals in a circumferential direction of the base layer, wherein the plurality of heat generating resistors have volume resistivities lower than that of the base layer, the heat generating resistors including a first heat generating resistor and a second heat generating resistor adjacent to each other in the circumferential direction, and the first heat generating resistor and the second heat generating resistor are at least partly overlapped in the circumferential direction.

According to another aspect, the present invention provides a fixing member for a fixing device, the fixing member comprising a cylindrical base layer, and a plurality of heat generating resistors extending in a longitudinal direction of the fixing member on the base layer, and arranged with intervals in a circumferential direction of the base layer, wherein the plurality of heat generating resistors have volume resistivities lower than that of the base layer, the plurality of heat generating resistors including a first heat generating resistor and a second heat generating resistor, an interval between the first heat generating resistor and the second heat generating resistor in the circumferential direction being the largest of the intervals between adjacent heat generating resistors, and a width, measured in the circumferential direction, of at least one of the first heat generating resistor and the second heat generating resistor is the largest of the widths, measured in the circumferential direction, of the plurality of heat generating resistors.

According to yet another aspect, the invention provides a fixing device for fixing an image on a recording material, the fixing device comprising a rotatable heating member contactable to the image, the rotatable heating member including a cylindrical base layer and a plurality of heat generating resistors extending in a longitudinal direction of the fixing member on the base layer, and arranged with intervals in a circumferential direction of the base layer, wherein the plurality of heat generating resistors have volume resistivities lower than that of the base layer, the plurality of heat generating resistors including a first heat generating resistor and a second heat generating resistor adjacent to each other in the circumferential direction, and the first heat generating resistor and the second heat generating resistor are at least partly overlapped in the circumferential direction. The fixing device also comprises a voltage application member configured to apply a voltage between longitudinal end portions of the plurality of heat generating resistors.

According to another aspect, the invention provides a fixing device for fixing a image on a recording material, the fixing device comprising a rotatable heating member contactable to the image, the rotatable heating member having a cylindrical base layer, and a plurality of heat generating resistors extending in a longitudinal direction of the fixing member on the base layer, and arranged with intervals in a circumferential direction of the base layer, wherein the plurality of heat generating resistors have volume resistivities lower than that of the base layer, the plurality of heat generating resistors including a first heat generating resistor and a second heat generating resistor, an interval between the first heat generating resistor and the second heat generating resistor in the circumferential direction being the largest of the intervals between adjacent heat generating resistors of the plurality of heat generating resistors, and a width, measured in the circumferential direction, of at least one of the first heat generating resistor and the second heat generating resistor is the largest of the widths, measured in the circumferential direction, of the plurality of heat generating resistors. The fixing device also comprises a voltage application member configured to apply a voltage between longitudinal end portions of the plurality of heat generating resistors.

In addition, according to another aspect, the present invention provides a method for manufacturing a fixing member for a fixing device, the method comprising a step of printing, on a cylindrical base layer, a plurality of heat generating resistors elongated in a longitudinal direction of the fixing member with intervals in a circumferential direction of the base layer, the plurality of heat generating resistors including a first heat generating resistor first printed on the base layer, and a second heat generating resistor last printed on the base layer, wherein the first heat generating resistor and the second heat generating resistor are printed so as to be at least partly overlapped with each other, in the printing step.

In yet another aspect, the present invention provides a method for manufacturing a fixing member for a fixing device, the method comprising a step of printing, on a cylindrical base layer, a plurality of heat generating resistors elongated in a longitudinal direction of the fixing member with intervals in a circumferential direction of the base layer, the heat generating resistors including a first heat generating resistor first printed on the base layer, and a second heat generating resistor last printed on the base layer, wherein a width, measured in the circumferential direction, of at least one of the first heat generating resistor and the second heat generating resistor is the largest of the widths, measured in the circumferential direction, of the plurality of heat generating resistors, wherein the second heat generating resistor is printed in the printing step so that the interval between the first heat generating resistor and the second heat generating resistor is the largest of the intervals between adjacent heat generating resistors of the plurality of heat generating resistors.

Further features of the present invention will become apparent from the following description of embodiments with reference to the attached drawings.

Figure 1:
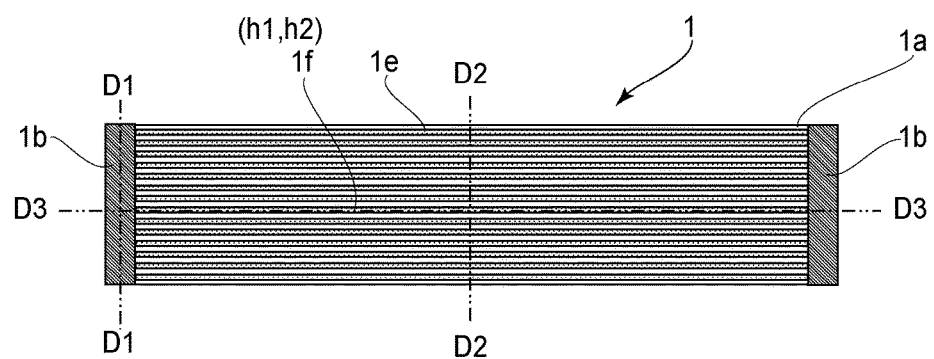
FIG. 1 is a schematic side view of the fixation film, as a rotational heating member, in the first embodiment of the present invention, as seen from the front side of the fixation film, showing the positioning of the electrically resistant heat generating strips.
Figure 2:
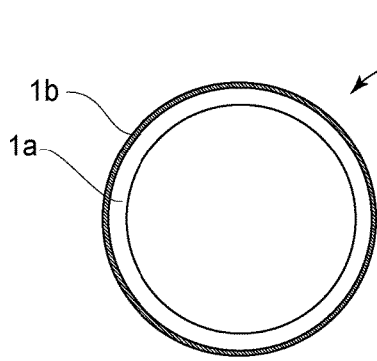
Figure 2:
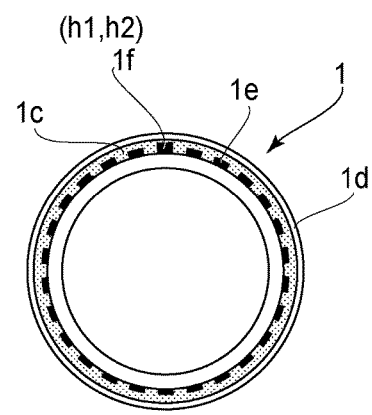

Part (a) of FIG. 2 is a schematic cross-sectional view of the one of the lengthwise end portions of the fixation film, at a line D1-D1 in FIG. 1, and part (b) of FIG. 2 is a schematic cross-sectional view of the center portion of the fixation film, at a line D2-D2 in FIG. 1.

Figure 3:
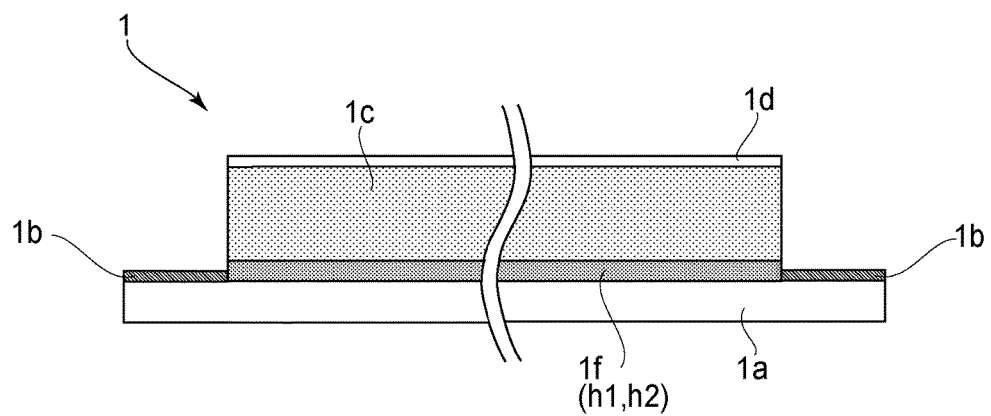

FIG. 3 is a schematic, vertical, and partial sectional view of the fixation film at a line D3-D3 in FIG. 1, that is parallel to the lengthwise direction of the fixation film.

Figure 4:
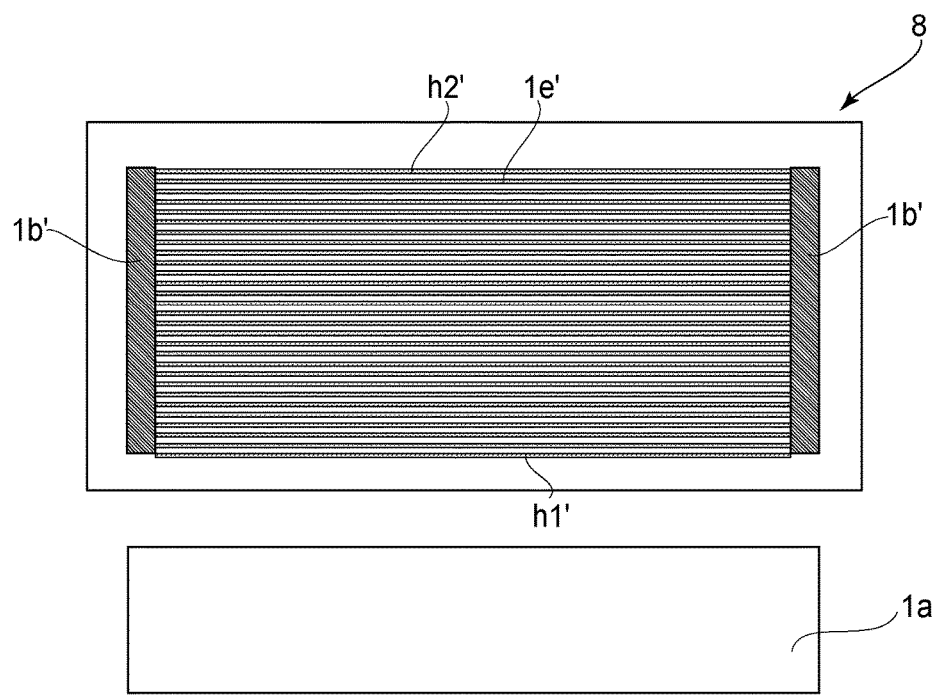

FIG. 4 is a schematic top view of a combination of the substrative layer of the fixation film, and the screen used for printing the electrically resistant heat generating strips.

Figure 5:
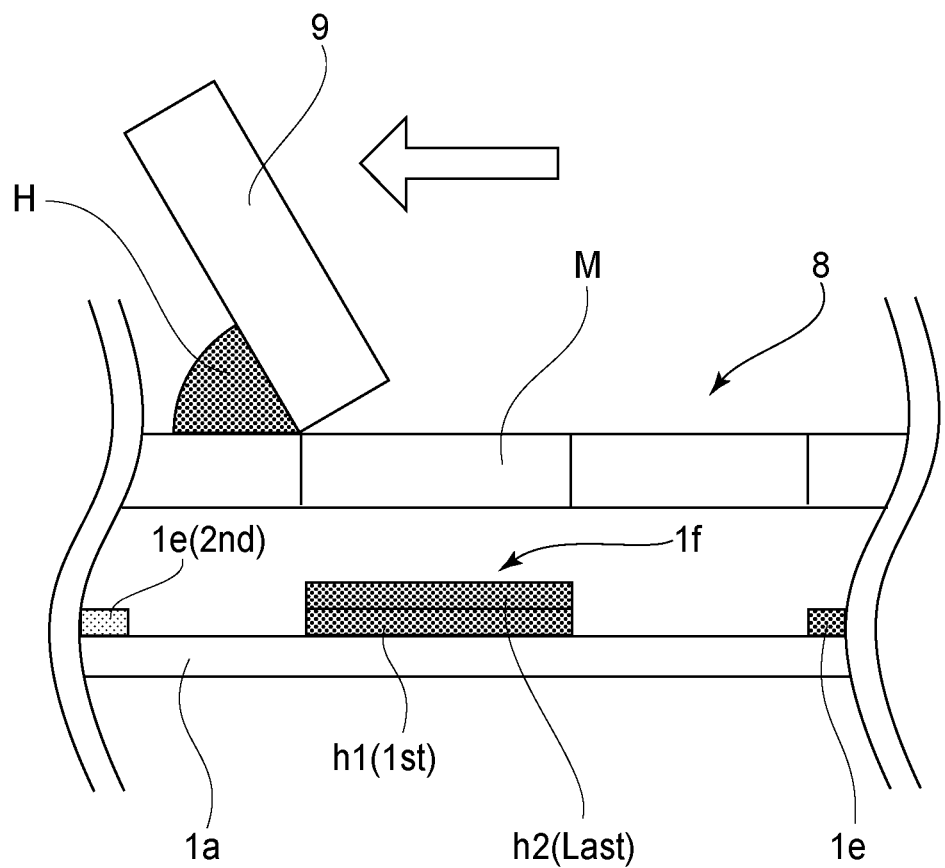

FIG. 5 is an enlarged schematic sectional view of the portion of the fixation film where the first and last electrically resistant heat generating strips overlap.

Figure 6:
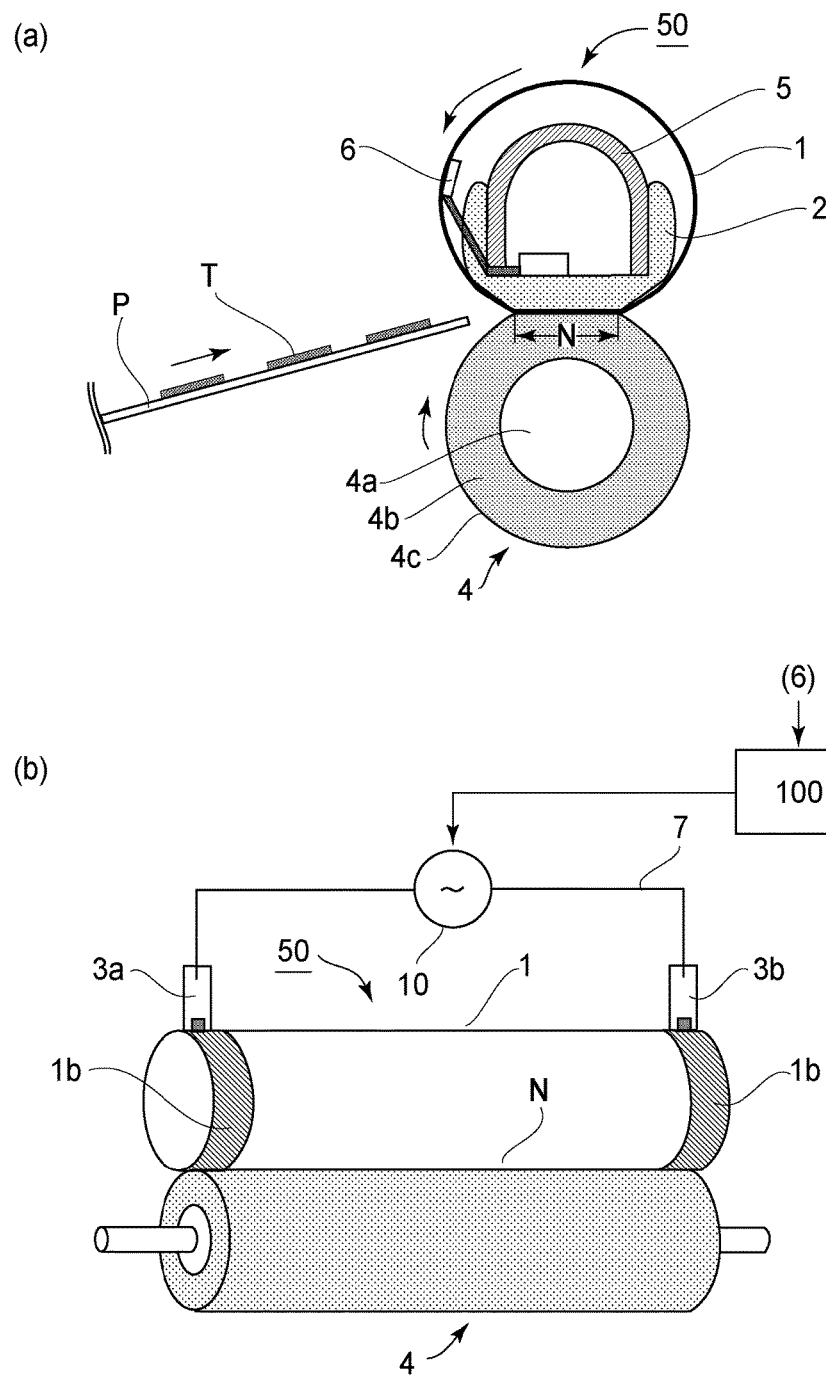

Parts (a) and (b) of FIG. 6 are schematic drawings of the essential portions of the fixing device in the first embodiment of the present invention.

Figure 7:
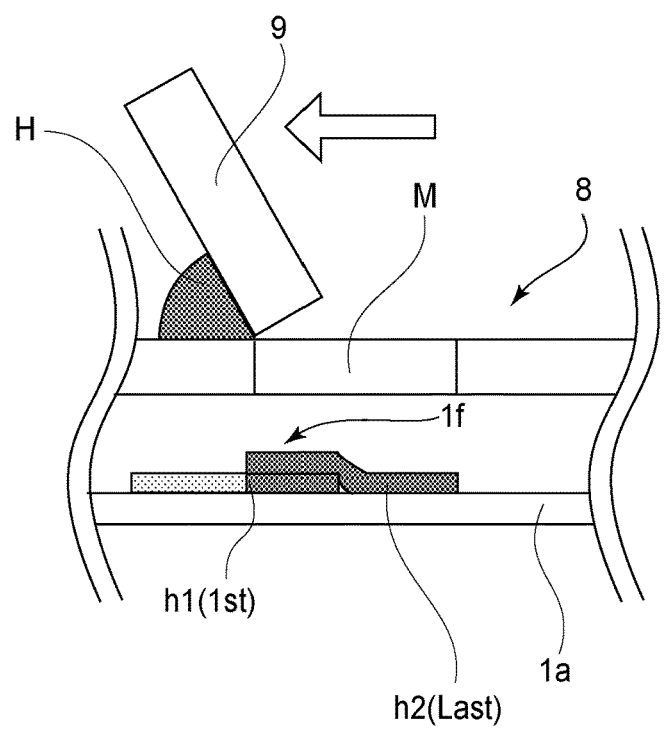
Figure 7:
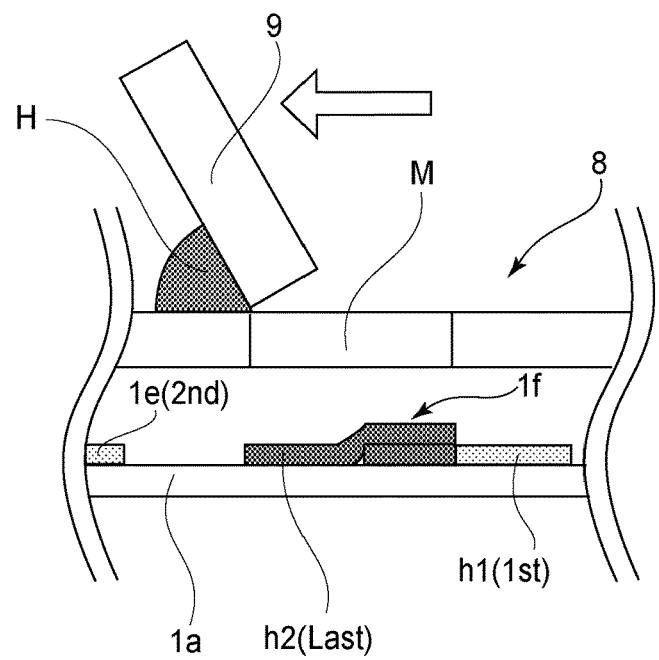

Parts (a) and (b) of FIG. 7 are enlarged schematic sectional views of the portion of the fixation film, in the modified version of the first embodiment, where the first and last electrically resistant heat generating strips overlap.

Figure 8:
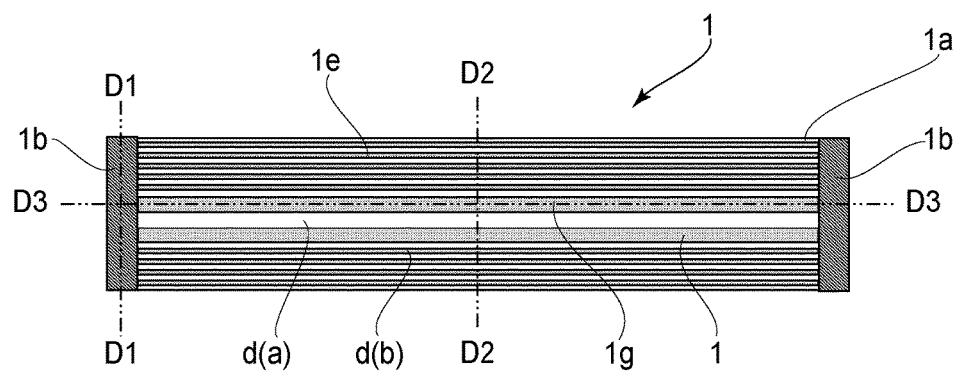

FIG. 8 is a schematic side view of the fixation film, as a rotational heating member, in the first embodiment, as seen from the front side of the fixing device, showing the positioning of the electrically resistant heat generating strips.

Figure 9:
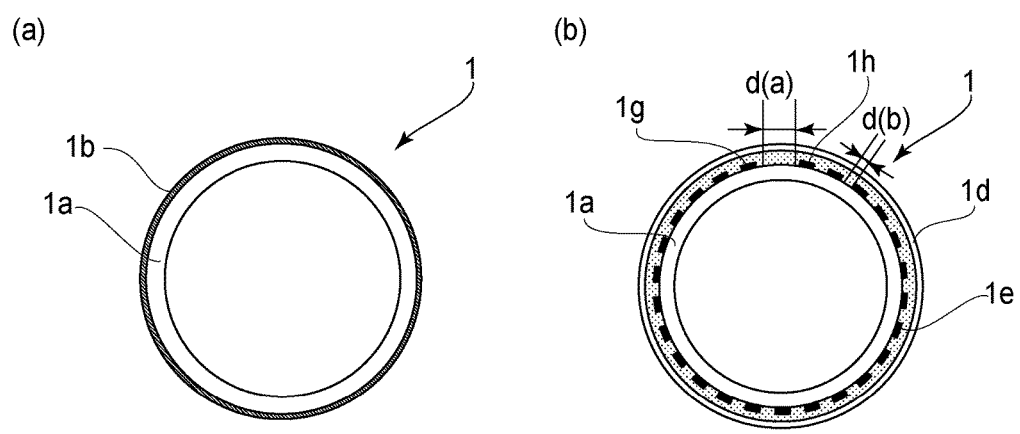

Part (a) of FIG. 9 is a schematic cross-sectional view of one of the lengthwise end portions of the fixation film, at a line D1-D1 in FIG. 8, and part (b) of FIG. 9 is a schematic cross-sectional view of the center portion of the fixation film, at a line D2-D2 in FIG. 8.

Figure 10:
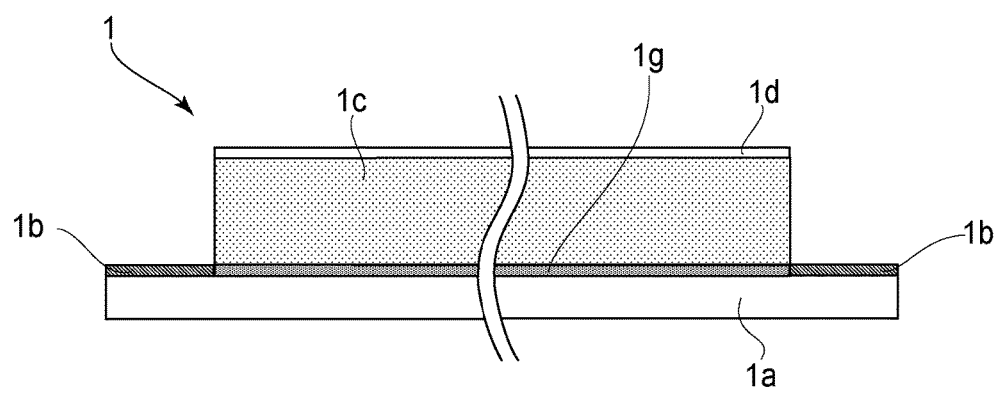

FIG. 10 is a schematic, vertical, partial, and sectional view of the fixation film at a line D3-D3 in FIG. 8.

Figure 11A:
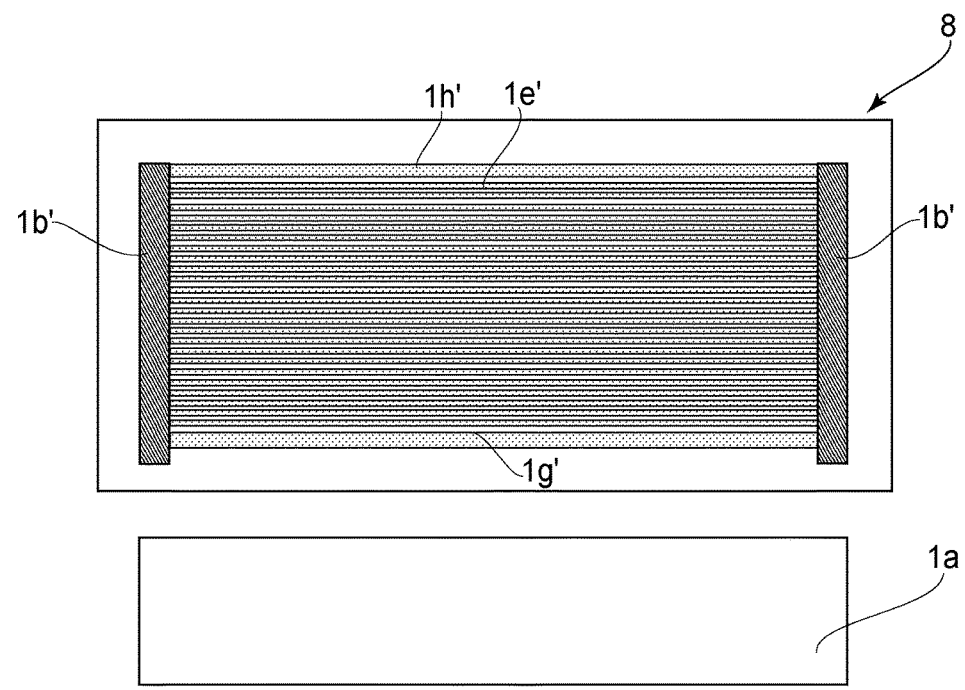

FIG. 11A is a schematic top view of a combination of the substrative layer of the fixation film, and the screen used for the printing of the electrically resistant heat generating strips.

Figure 11B:
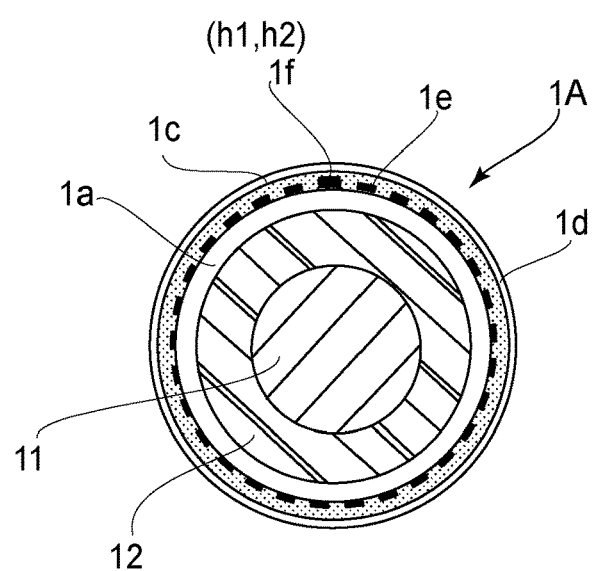
Figure 11B:
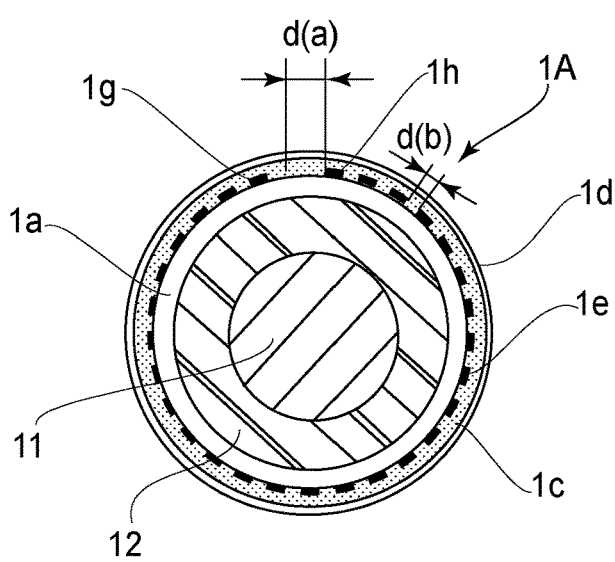

Parts (a) and (b) of FIG. 11B are schematic cross-sectional views of an example of rotational heating member that is in the form of a roller.

Figure 12:
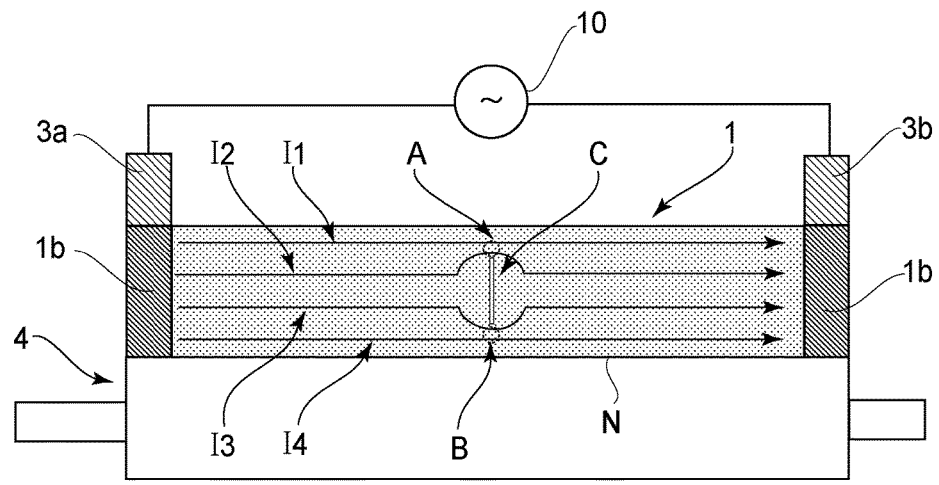

FIG. 12 is a schematic drawing of the essential portions of a referential fixing device that employs a rotational heating member having an electrically resistant heat generating layer.

Figure 13:
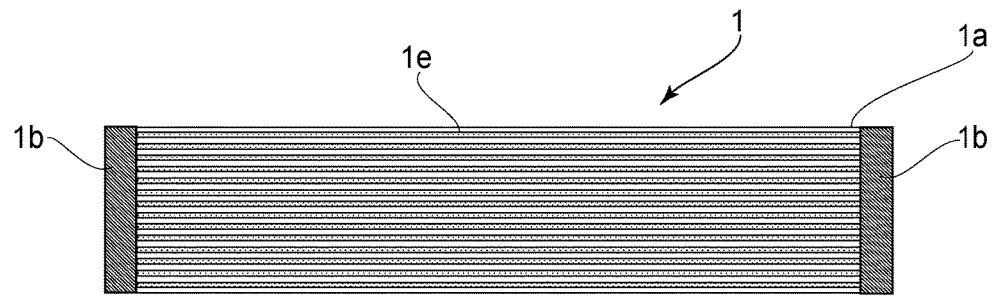

FIG. 13 is a schematic drawing of a referential fixation film having multiple electrically resistant heat generating strips.

Figure 14:
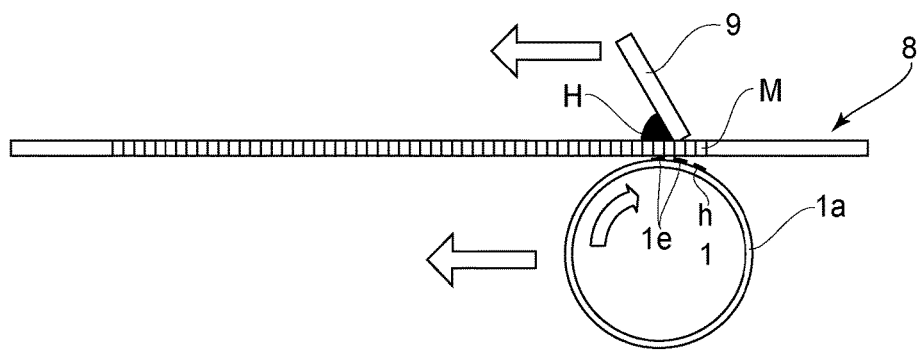
Figure 14:
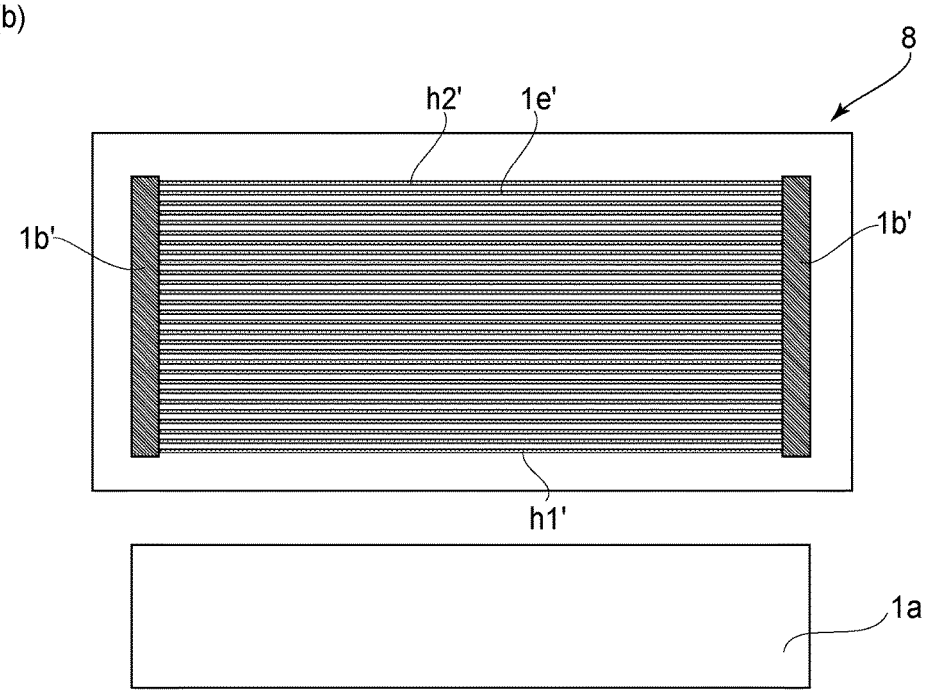

FIG. 14 is a schematic drawing for describing the process of screen printing.

Figure 15:
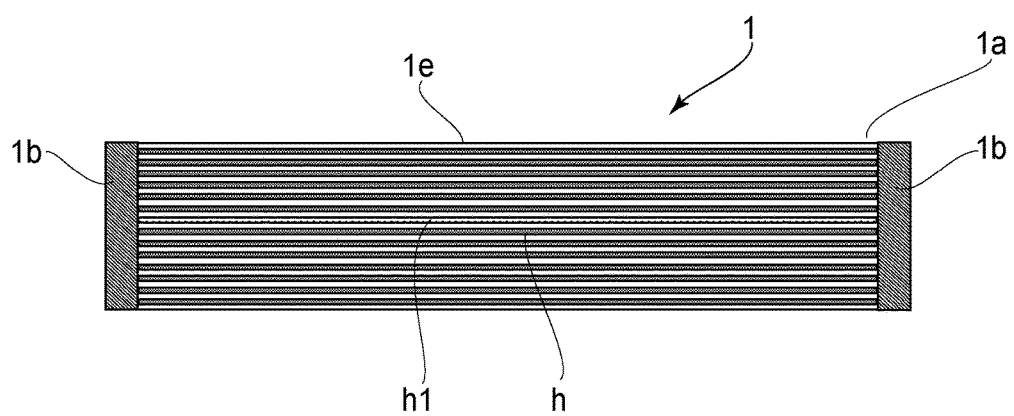

FIG. 15 is a schematic drawing of a fixation film, showing the thinning that occurs when printing a first electrically resistant heat generating strip on the printing junction portion of the substrative layer of the fixation film.

DESCRIPTION OF THE EMBODIMENTS

Hereafter, the rotational heating member of the present invention, and an example of image forming apparatus employing the rotational heating member, are described. By the way, in the following description of the rotational heating member and the image forming apparatus, the "lengthwise direction" refers to the direction that is parallel to the generatrix of the rotational heating member. The "circumferential direction" refers to the direction that is parallel to the direction in which the rotational heating member rotates. The "thickness direction" refers to the direction that is parallel to the diameter direction of the rotational heating member.

Embodiment 1

Next, the first embodiment of the present invention is described with reference to FIGS. 1 to 7. To begin with, a structure of a fixation film 1 (fixing member), as a rotational heating member, is described. Then, a fixing device (image heating apparatus) 50 that employs the fixation film 1 is described.

[Fixation Film]

Referring to FIGS. 1 to 3, the structure of the fixation film 1 in this embodiment is described. The fixation film 1 has a cylindrical substrative layer 1a, and a preset number of electrically resistant heat generating strips 1e (heat generating strips) that are formed on the substrative layer 1a by printing in such a manner that the heat generating strips 1e extend in the lengthwise direction, with the presence of a preset interval between two adjacent electrically resistant heat generating strips 1e. The electrically resistant heat generating strips 1e are smaller in volume resistivity than the substrative layer 1a. Further, the fixation film 1 has a pair of electrically conductive layers 1b that are formed on the lengthwise end portions of the substrative layer 1a, one for one, in such a manner that the pair of electrically conductive layers 1b encircle the substrative layer 1a in connection (physically and electrically) to the electrically resistant heat generating strips 1e, and that are smaller in volume resistivity than the substrative layer 1a. Further, one of the characteristic features of this fixation film 1 is that two of the electrically resistant heat generating strips 1e, more specifically, the electrically resistant heat generating strip h1 (first electrically resistant heat generating strip) and the electrically resistant heat generating strip h2 (second electrically resistant heat generating strip) at least partially overlap in terms of the direction parallel to the circumferential direction of the substrative layer 1a.

FIG. 1 is a schematic drawing of the fixation film 1 as seen from a front side, and shows the positioning of the electrically resistant heat generating strips 1e. Part (a) of FIG. 2 is a schematic cross-sectional view of the one of the lengthwise end portions of the fixation film 1, at a line D1-D1 in FIG. 1, and part (b) of FIG. 2 is a schematic cross-sectional view of the center portion of the fixation film 1, at a line D2-D2 in FIG. 1, in terms of the lengthwise direction. FIG. 3 is a schematic, vertical, and partial sectional view of the fixation film 1 at a line D3-D3 in FIG. 1 that is parallel to the lengthwise direction of the fixation film 1.

The fixation film 1 has the substrative layer 1a, the pair of electrically conductive layers 1b, the electrically resistant heat generating strips 1e, an elastic layer 1c, and a release layer 1d. The fixation film 1 is flexible. If the fixation film 1 is left unattended, it remains roughly cylindrical due to the elasticity of the fixation film 1. While FIG. 1 does not show the elastic layer 1c or the release layer 1d, FIG. 2 shoes these elements.

The substrative layer 1a is a cylindrical member that is dielectric or high in electrical resistance. The substrative layer 1a is a base layer that provides the fixation film 1 with such mechanical properties as torsional rigidity and smoothness. The substrative layer 1a is formed of a resin, such as polyimide (PI), polyamideimide (PAI), or polyether-etherketone (PEEK). In this embodiment, the substrative layer 1a is made of polyimide, and is 18 mm in external diameter, 240 mm in length, and 60 µm in thickness.

In order to supply the electrically resistant heat generating strips 1e with electrical power from the outward side of the fixation film 1, the fixation film 1 is provided with the pair of electrically conductive layers 1b, formed of silver paste, on the lengthwise end portions, one for one, of the substrative layer 1a in such a pattern that the electrically conductive layers 1b are 10 mm in width in terms of the lengthwise direction of the fixation film 1, and also, so that the pair of electrically conductive layers 1b encircle the entirety of the lengthwise end portions of the substrative layer 1a in the circumferential direction of the substrative layer 1a. In this embodiment, a silver paste having a volume resistivity of $4 \times 10^{-5}$ Ω·cm was used as the material for the pair of electrically conductive layers 1b for power supply. The silver paste is a compound formed by dispersing microscopic particles of silver in a polyimide resin, with the use of solvent. The silver paste was sintered after its deposition on the substrative layer 1a.

The electrically resistant heat generating strips 1e are formed on the substrative layer 1a. Each electrically resistant heat generating strip 1e is electrically in connection to the electrically conductive layers 1b and 1b by lengthwise ends of the electrically resistant heat generating strip 1e, one for one. That is, each electrically resistant heat generating strip 1e is in connection to the electrically conductive layers 1b and 1b so that electrical current is allowed to flow through the electrically resistant heat generating strips 1e that are between the electrically conductive layers 1b and 1b. In this embodiment, a silver paste having a volume resistivity of $2 \times 10^{-3}$ Ω·cm was used as the material for the electrically resistant heat generating strips 1e. The silver paste was coated on the peripheral surface of the substrative layer 1a by screen printing.

FIG. 4 is a schematic top view of a combination of the substrative layer 1a of the fixation film 1, and the screen 8 used for printing the electrically resistant heat generating strips 1e, in this embodiment. The area 1b' of the screen 8 forms the electrically conductive layers 1b and 1b, and the area 1e' of the screen 8 forms the electrically resistant heat generating strips 1e. Among the preset number of electrically resistant heat generating strips 1e, the one printed first is referred to as an electrically resistant heat generating strip h1, and the one printed last is referred to as an electrically resistant heat generating strip h2. In this case, the area h1' of the screen 8 forms the electrically resistant heat generating strip h1, and the area h2' forms the electrically resistant heat generating strip h2.

With the use of this screen 8, a preset number of strips of silver paste that are 1 mm in width (the width being a dimension in terms of a circumferential direction), roughly 10 µm in thickness, and the same in volume resistivity, are printed in parallel in the lengthwise direction, with the placement of a preset interval d of 1 mm between two adjacent electrically resistant heat generating strips 1e (i.e., at a pitch of 2 mm), in such a manner that, as the substrative layer 1a is rotated once, the electrically resistant heat generating strip h2 is overlaid on the electrically resistant heat generating strip h1, or the electrically resistant heat generating strip printed first. By the way, it is desired that the electrically resistant heat generating strips 1e are no less than 0.20 mm and no more than 2.0 mm in width (in terms of the circumferential direction), and the interval d between two adjacent electrically resistant heat generating strips 1e is no less than 0.20 mm and no more than 2.0 mm.

FIG. 5 is an enlarged sectional view of the portion of the fixation film 1 on which the electrically resistant heat generating strip h1, printed first during a process in which the fixation film 1 in this embodiment was manufactured, and the electrically resistant heat generating strip h2, printed last during the process, are present. After the completion of this process, the substrative layer 1a and the strips of silver paste on the substrative layer 1a are sintered to remove moisture, binding agents, etc., in the strips to yield the electrically resistant heat generating strips 1e, forming an electrically resistant heat generating strip 1f (h1+h2). The electrically resistant heat generating strips 1e are roughly 10 µm in thickness. The heat generating strip 1f, formed when the electrically resistant heat generating strip h2 was printed on the electrically resistant heat generating strip h1, is roughly 20 µm in thickness.

By the way, after the formation of the pair of electrically conductive layers 1b on the substrative layer 1a, as described above, the electrical resistance between the pair of electrically conductive layers 1b was 15.7Ω. The total number of electrically resistant heat generating strips 1e, inclusive of the electrically resistant heat generating strip 1f, is 28. The electrical resistance between the lengthwise ends of the electrically resistant heat generating strip 1f is roughly 230Ω. The electrical resistance between the lengthwise ends of each electrically resistant heat generating strip 1e is roughly 460Ω.

In this embodiment, the electrically resistant heat generating strips 1e and 1f, the material for which is silver paste having a volume resistivity of $2 \times 10^{-3}$ Ω·cm, and the electrically conductive layers 1b and 1b, the material for which has a volume resistivity of $4 \times 10^{-5}$ Ω·cm, are formed at the same time by screen printing with the use of the screen 8. The manufacturing process may, however, be altered so that one of the electrically resistant heat generating strips 1e and 1f and the pair of electrically conductive layers 1b is formed first by screen printing and sintering, and then, the other of the electrically resistant heat generating strips 1e and 1f and the pair of electrically conductive layers 1b is formed by screen printing and sintering.

The elastic layer 1c is formed of a compound made by dispersing a thermally conductive filler in a silicone rubber. The elastic layer 1c is 170 µm in thickness. The release layer 1d is formed of PFA. The release layer 1d is formed by being coated on the elastic layer 1c. The release layer 1d is roughly 15 µm in thickness. The elastic layer 1c and the release layer 1d are dielectric. They cover the electrically resistant heat generating strips 1e and 1f and their intervals, leaving the pair of electrically conductive layers 1b exposed across their peripheral surface.

[Fixing Device]

Next, referring to FIG. 6, a structure of the fixing device 50 in this embodiment, as an image heating apparatus, is described. Part (a) of FIG. 6 is a schematic cross-sectional view of the lengthwise center portion of the essential portion of the fixing device 50 in this embodiment. Part (b) of FIG. 6 is a schematic drawing of the essential portion of the fixing device 50 as seen from a direction that is diagonal to the lengthwise direction.

This fixing device 50 is an apparatus for thermally fixing a toner image T, formed on a sheet P of recording medium with the use of an ordinary electrophotographic image forming method, to the sheet P. The sheet P bearing the toner image T is conveyed to the fixing device 50 by a conveying means (unshown) from the left side of part (a) of FIG. 6, and is introduced into the fixing device 50. As the sheet P is conveyed through the fixing device 50, the toner image T on the sheet P is thermally fixed to the sheet P.

The fixing device 50 in this embodiment has the cylindrical fixation film 1 as a rotational heating member, and a film guide 2 inserted in a hollow of the fixation film 1 to support the fixation film 1. The fixing device 50 also has an elastic pressure roller 4, as a pressure applying member (nip forming member), that forms a nip N (fixation nip) in cooperation with the fixation film 1. The pressure roller 4 is rotatably supported, at lengthwise end portions, by a frame (unshown) of the fixing device 50, with the placement of a pair of bearings between the pressure roller 4 and the frame. In the case of the apparatus in this embodiment, the pressure roller 4, as a rotationally drivable member, is rotationally driven at a preset peripheral velocity in the clockwise direction indicated by an arrow mark in part (a) of FIG. 6 by a driving mechanism portion 101 that is controlled by a control portion 100 (CPU).

The film guide 2 is formed of a heat resistant resin, such as a liquid polymer, PPS, and PEEK. Lengthwise ends of the film guide 2 engage with a fixation stay 5 that held by the frame (unshown) of the fixing device 50. Lengthwise end portions of the fixation stay 5 are under pressure generated by a pair of compression springs (unshown) as a pressure applying means. Thus, the film guide 2 remains pressured toward the pressure roller 4 with the presence of the fixation film 1 between itself and the pressure roller 4.

In order to ensure that the pressure received by the lengthwise end portions of the fixation stay 5 is uniformly applied to the film guide 2 in terms of the lengthwise direction, a rigid plate, such as an iron plate, a stainless steel plate, a Zinc-coated steel plate, and the like, may be used as the material for the fixation stay 5. Further, in order to increase the rigidity of the fixation stay 5, the fixation stay 5 is formed so that a cross-section of the fixation stay is U-shaped. Thus, the film guide 2 is pressed against the pressure roller 4 without being made to warp by the elasticity of the pressure roller 4 with the presence of the fixation film 1 between itself and the pressure roller 4. Further, a fixation nip N that is uniform in width, in terms of the lengthwise direction of the pressure roller 4, is formed between the fixation film 1 and the pressure roller 4.

In this embodiment, a liquid polymer was used as the material for the film guide 2. As the material for the fixation stay 5, a piece of zinc-coated steel plate was used. The amount of pressure applied to the pressure roller 4 is 160 N, and the pressure roller 4 forms the fixation nip N that is roughly 6 mm in dimension in terms of the direction perpendicular to the lengthwise direction.

The fixing device 50 is provided with a temperature detection element 6 that is attached to the film guide 2 in a manner so as to remain in contact with the inward surface of the fixation film 1. The information about the temperature detected by the temperature detection element 6 is inputted into the control portion 100 that controls the amount by which electrical power is supplied to the fixation film 1 from an AC power source 10 (power supplying portion), based on the information about the temperature of the fixation film 1 inputted from the temperature detection element 6, so that the temperature of the fixation film 1 increases to a preset level and remains at the preset level.

The pressure roller 4 is made up of a metallic core 4a, an elastic layer 4b, and a release layer 4c. The material for the metallic core 4a is iron, aluminum, or the like. The material for the elastic layer 4b is a silicone rubber, or the like. The material for the release layer 4c is PFA, or the like. In order to ensure that the fixation nip N formed by the pressure roller 4 is wide enough for satisfactory fixation, and also, that the pressure roller 4 is satisfactory in durability, it is desired that the hardness of the pressure roller 4 measured with the use of an ASKER-C hardness gauge under a load of 9.8 N is desired to be in a range of 40° to 70°. In this embodiment, the silicon rubber layer 4b was formed on the peripheral surface of the metallic core 4a to a thickness of 3.5 mm. Then, the combination was covered with a piece of dielectric PFA tube that is 40 μm in thickness. The resulting pressure roller 4 is 56° in hardness, and 18 mm in external diameter. Both the elastic layer 4b and release layer 4c are 240 mm in length.

Power supplying members 3a and 3b are in connection to the AC power source 10 through AC cables 7. The power supplying members 3a and 3b are in contact with the peripheral surface of each of the pair of electrically conductive layers 1b that are parts of the lengthwise end portions of the fixation film 1. As the power supplying members 3a and 3b, a brush formed of bundles of fine gold wires or the like, a leaf spring, a pad, or the like, may be used.

In this embodiment, a combination of a carbon chip and a stainless leaf spring was used as each of the power supplying members 3a and 3b (voltage applying members). The carbon chip is pressed on the exposed portion of the peripheral surface of the electrically conductive layer 1b by the resiliency of this leaf spring, whereby an alternating voltage is applied to the electrically conductive layer 1b from the AC voltage source 10 through the AC cable 7. Thus, the voltage is applied between the pair of electrically conductive layers 1b, whereby the electrically resistant heat generating strips 1e of the fixation film 1 are supplied with electrical power. In this embodiment, the pair of electrically conductive layers 1b are disposed on the lengthwise end portions of the substrative layer 1a of the fixation film 1, one for one, making it possible for all the electrically resistant heat generating strips 1e and 1f to be always supplied with electrical power even while the fixation film 1 is rotated.

The operation of the fixing device 50 is as follows. The pressure roller 4 is rotationally driven at a preset speed in the clockwise direction indicated by an arrow mark in part (a) of FIG. 6. As the pressure roller 4 is rotationally driven, the friction between the pressure roller 4 and the fixation film 1 acts on the fixation film 1 in such a direction to cause the fixation film 1 to rotate, in the fixation nip N. Thus, the fixation film 1 is rotated by the rotation of the pressure roller 4 around the film guide 2 in the counter clockwise direction indicated by another arrow mark in part (a) of FIG. 6, sliding on the film guide 2, with its inward surface remaining in contact with the film guide 2.

As the fixation film 1 is rotated by the rotation of the pressure roller 4, and is supplied with electrical power, the fixation film 1 is controlled in temperature by the combination of the temperature detection element 6 and the control portion 100, so that the temperature of the fixation film 1 increases to the preset level and remains at the preset level. Then, a sheet P of recording medium bearing an unfixed toner image T is introduced into the fixation nip N, and is conveyed through the fixation nip N along with the fixation film 1, remaining pinched between the pressure roller 4 and the fixation film 1, with the toner image bearing surface of the sheet P remaining in contact with the fixation film 1.

While the sheet P bearing the unfixed toner image T is conveyed through the fixation nip N, the sheet P and the unfixed toner image T thereon are heated by the heat from the fixation film 1 and are pressed. Thus, the unfixed toner image T melts, and becomes fixed (welded) to the sheet P as it cools down. As the sheet P is conveyed through the fixation nip N, the sheet P is separated from the surface of the fixation film 1 by the curvature of the fixation film (film guide 2). Then, the sheet P is conveyed further by a pair of discharge rollers (unshown).

In the case of the fixation film 1 in this embodiment, the electrically resistant heat generating strip 1f is formed of the electrically resistant heat generating strip h1, printed first, and the electrically resistant heat generating strip h2, printed last, in a manner to be overlaid on the electrically resistant heat generating strip h1, and, therefore, is twice in thickness compared to the other electrically resistant heat generating strips 1e. Further, the electrically resistant heat generating strip 1f and the adjacent electrically resistant heat generating strips 1e are connected in parallel, at their lengthwise end portions, by the pair of electrically conductive layers 1b. Therefore, the amount by which electrical current is allowed to flow through the electrically resistant heat generating strip 1f is roughly twice the amount by which electrical current is allowed to flow through each of the electrically resistant heat generating strips 1e.

Thus, even if the electrically resistant heat generating strip 1e that was printed second happened to be formed to be relatively thinner or noncontinuous, as shown in FIG. 5, due to the transfer of the silver paste, of which each of the electrically resistant heat generating strips 1e is made, during the manufacturing of the fixation film 1, the electrically resistant heat generating strip 1f can compensate for the second heat generating strip 1e in the amount of heat generation, because the electrically resistant heat generating strip 1f generates twice as much heat as the electrically resistant heat generating strips 1e. Therefore, it does not occur that the portion of the fixation film 1, corresponding in position to the printing junction, is insufficient in the amount of heat generation. Further, it does not occur that unsatisfactory fixation occurs in synchronism with the rotation of the fixation film 1.

By the way, it is unnecessary that the electrically resistant heat generating strip h2, that is, the one printed last, perfectly overlaps with the electrically resistant heat generating strip h1, that is, the one printed first. That is, the electrically resistant heat generating strip h2 may only partially overlap with the electrically resistant heat generating strip h1. FIG. 7 shows a modified version of this embodiment. Part (a) of FIG. 7 shows the heat generating strip 1f formed as a result of the process for manufacturing the fixation film 1 being set up so that the electrically resistant heat generating strip h2 begins to overlap with the electrically resistant heat generating strip h1 after it is partially printed. In this case, the trailing end portion of the electrically resistant heat generating strip h1 in terms of the rotational direction of the substrative layer 1a is thinned. The area where the overlapping occurs, is thicker, and, therefore, is greater in the amount of heat generation, and is next to the area where the thinning occurs. Therefore, it is possible to prevent the problem that the image forming apparatus 100 forms defective images, the defects of which correspond in position to the printing junction.

Part (b) of FIG. 7 shows the heat generating strip 1f formed as a result of the process for manufacturing the fixation film 1 being set up so that the electrically resistant heat generating strip h2 begins to be printed to partially overlap with the electrically resistant heat generating strip h1 after the first heat generating electrically resistant strip h1 moved past the screen 8 for the second time after it was printed. In this case, the leading end portion of the electrically resistant heat generating strip h1 in terms of the rotational direction of the substrative layer 1a, and the electrically resistant heat generating strip 1e that was printed second are thinned as illustrated. The portion of the substrative layer 1a on which the electrically resistant heat generating strips h1 and h2 overlap, as in the case illustrated in part (a) of FIG. 7, is thicker, and, therefore, generates greater amount of heat. Therefore, unsatisfactory fixation caused by the portion of the fixation film 1 corresponding in position to the printing junction is less likely to occur.

By the way, in a case in which the electrically resistant heat generating strips 1e are divided into several groups, and each group is separately printed from the others, the printing junction occurs during every printing process. In such a case, an effect similar to the above-described one can be obtained by setting up the printing process so that the electrically resistant heat generating strip that is to be printed first in a second run of the printing process is laid on the electrically resistant heat generating strip to be printed last during a first run of the printing process.

As described above, by printing the electrically resistant heat generating strips 1e so that the electrically resistant heat generating strip h2 at least partially overlaps with the electrically resistant heat generating strip h1, it is possible to compensate the printing junction for the insufficiency in the amount of heat generation. Therefore, it is possible to prevent the unsatisfactory fixation (unsatisfactory heating) that is caused by the portion of the fixation film 1 that corresponds in position to the printing junction.

Embodiment 2

The second embodiment differs from the first embodiment in the pattern of the electrically resistant heat generating strips printed on the portion of the substrative layer 1a, corresponding in position to the printing junction. Referring to FIGS. 8 to 10, the structure of the fixation film 1 in the second embodiment is described.

FIG. 8 is a schematic side view of the fixation film 1, as a rotational heating member, in the second embodiment, as seen from the front side of the fixing device 50. FIG. 8 shows the positioning of the electrically resistant heat generating strips 1e. Part (a) of FIG. 9 is a schematic cross-sectional view of one of the lengthwise end portions of the fixation film 1, at a line D1-D1 in FIG. 8, and part (b) of FIG. 9 is a schematic cross-sectional view of the center portion of the fixation film 1, at a line D2-D2 in FIG. 8. FIG. 10 is a schematic, vertical, partial, and sectional view of the fixation film 1 at a line D3-D3 in FIG. 8. Like FIG. 1, FIG. 8 does not show the elastic layer 1c or the release layer 1d.

Like the fixation film 1 in the first embodiment, the fixation film 1 in the second embodiment also has a cylindrical substrative layer 1a. The fixation film 1 has also a preset number of electrically resistant heat generating strips 1e formed on the substrative layer 1a by printing. The electrically resistant heat generating strips 1e are smaller in volume resistivity than the substrative layer 1a. Further, the fixation film 1 has a pair of electrically conductive layers 1b formed on the lengthwise ends of the substrative layer 1a. Each of the pair of electrically conductive layers 1b extend in the circumferential direction of the substrative layer 1a, in contact with the electrically resistant heat generating strips 1e, having thereby an electrical connection with the electrically resistant heat generating strips 1e. The electrically conductive layers 1b are smaller in volumetric resistivity than the substrative layer 1a.

The characteristic of the fixation film 1 in this embodiment is that the interval d(a) between the adjacent electrically resistant heat generating strips 1g and 1h is greater than the other intervals d(b) among the electrically resistant heat generating strips 1e, and also, that at least one of the electrically resistant heat generating strips 1g and 1h, the interval between which is greater than the intervals d(b) among the other electrically resistant heat generating strips 1e, is greater in width (dimension in terms of circumferential direction of fixation film 1).

More concretely, the interval d(a) between the electrically resistant heat generating strip 1g, printed first, and the electrically resistant heat generating strip 1h, printed last, is greater than the interval d(b) between two other adjacent electrically resistant heat generating strips 1e, and the electrically resistant heat generating strip 1g and the electrically resistant heat generating strip 1h are greater in width than the other electrically resistant heat generating strips 1e.

FIG. 11A is a top view of a combination of the substrative layer 1a of the fixation film 1 and the screen 8 used in the second embodiment. The areas 1b' of the screen 8 form the pair of electrically conductive layers 1b. The areas 1e' form the electrically resistant heat generating strips 1e. The area 1g' of the screen 8 forms the electrically resistant heat generating strip 1g, printed first among the electrically resistant heat generating strips 1e. The area 1h' forms the electrically resistant heat generating strip 1h, printed last among the electrically resistant heat generating strips 1e.

First, the electrically resistant heat generating strip 1g that is 2 mm in dimension in terms of the circumferential direction of the fixation film 1 is printed with the use of this screen 8. Then, a preset number of electrically resistant heat generating strips 1e that are the same in volumetric resistivity as the electrically resistant heat generating strip 1g, and are 1 mm in dimension (width W=1 mm) in terms of the circumferential direction of the fixation film 1, are formed parallel to the lengthwise direction, with the placement of intervals d(b) therebetween (2 mm pitch). Lastly, the electrically resistant heat generating strip 1h that is 2 mm in width (dimension in terms of circumferential direction of substrative layer 1a) is printed. The screen 8 is provided with such a pattern that, after the completion of the printing process, the interval d(a) between the electrically resistant heat generating strip 1g that is printed first, and the electrically resistant heat generating strip 1h that is printed last, will be 3 mm (d(a)=3 mm). Therefore, it does not occur that the electrically resistant heat generating strip 1g comes into contact with the screen 8 after it is printed first.

After the printing of these electrically resistant heat generating strips 1e, the moisture and binding components in the silver paste are removed by sintering to yield the actual electrically resistant heat generating strips 1e, 1g and 1h. The electrically resistant heat generating strips 1e, 1g and 1h are all roughly 10 μm in thickness. After the formation of the pair of electrically conductive layers 1*b* on the substrative layer 1*a*, the electrical resistance between the pair of electrically conductive layers 1*b* is 15.7Ω. The number of the electrically resistant heat generating strips 1*e* (inclusive of 1*g* and 1*h*) is 26. The electrical resistance between the lengthwise ends of each of the electrically resistant heat generating strips 1*g* and 1*h* is roughly 220Ω. The electrical resistance between the lengthwise ends of each of the other electrically resistant heat generating strips 1*e* is roughly 440Ω.

In the second embodiment, the electrically resistant heat generating strip 1*g* that was printed first and the electrically resistant heat generating strip 1*h* that was printed last are twice the other electrically resistant heat generating strips 1*e* in the width (dimension in terms of circumferential direction of substrative layer 1*a*). The electrically resistant heat generating strips 1*e*, 1*h*, and 1*g* are connected in parallel with the pair of electrically conductive layers 1*b* printed on the lengthwise end portions of the substrative layer 1*a*, one for one. Further, the electrically resistant heat generating strips 1*g* and 1*h* are twice the electrically resistant heat generating strip 1*e* in width, being, therefore, twice in the amount of heat generation compared to the heat generating strip 1*e*.

Further, the interval d(a) between the electrically resistant heat generating strip 1*g* that was printed first and the electrically resistant heat generating strip 1*h* that was printed last is 3 mm, and is three times the interval d(b) between the adjacent two of the other electrically resistant heat generating strips 1*e*. Thus, it does not occur that the electrically resistant heat generating strip 1*g* comes into contact with the screen 8 when the electrically resistant heat generating strip 1*h* is printed. Therefore, it does not occur that the precursor (silver paste strip) of the electrically resistant heat generating strip 1*g* is thinned by the screen 8.

Although the interval d(a) between the electrically resistant heat generating strips 1*g* and 1*h* is greater that the interval d(b) between two other adjacent electrically resistant heat generating strips 1*e*, the electrically resistant heat generating strips 1*g* and 1*h* are twice the other electrically resistant heat generating strips 1*e*, in the amount of heat generation. Therefore, it does not occur that the portion of the fixation film 1, corresponding in position to the printing junction, becomes insufficient in the amount of heat generation. Further, it does not occur that the unsatisfactory fixation (insufficient heating) occurs in synchronism with the rotation of the fixation film 1. By the way, it is desired that the electrically resistant heat generating strips 1*e* are no less than 0.2 mm and no more than 2.0 mm in width (dimension in terms of circumferential direction of fixation film 1), and also, that the interval d(b) between two adjacent electrically resistant heat generating strips 1*e* is no less than 0.20 mm and no more than 2.0 mm.

By the way, in this embodiment, both the electrically resistant heat generating strip 1*g* that is printed first and the electrically resistant heat generating strip 1*h* that is printed last are made greater in width than the other electrically resistant heat generating strips 1*e*. Only one of the electrically resistant heat generating strips 1*g* and 1*h* may, however, be made greater in width. By adjusting a width of at least one of the electrically resistant heat generating strips 1*g* and 1*h*, printed first and last, respectively, it is possible to increase the interval d(a) between the electrically resistant heat generating strips 1*g* and 1*h* so that the electrically resistant heat generating strip 1*g* that is printed first does not come into contact with the screen 8.

Further, in a case in which the electrically resistant heat generating strips are divided into a preset number of groups that are separately printed, the printing junction occurs each time a group of electrically resistant heat generating strips is printed after the preceding group. In such a case, an effect similar to the above-described one can be obtained by printing the first electrically resistant heat generating strip in the following group, with the provision of a greater interval from the last electrically resistant heat generating strip in the preceding group of electrically resistant heat generating strips than the normal interval, and increasing both or one of the two electrically resistant heat generating strips in width.

As described above, the interval d(a) between the electrically resistant heat generating strips 1*g* and 1*h*, corresponding in position to the printing junction, is made greater than the interval d(b) between any other two adjacent electrically resistant heat generating strips 1*e*, and at least one of the two electrically resistant heat generating strips 1*g* and 1*h* separated by the interval d(a) is made greater in width (dimension in terms of circumferential direction of fixation film 1) than the other electrically resistant heat generating strips 1*e*. Thus, it is possible to compensate the portion of the fixation film 1, corresponding in position to the printing junction, for the insufficiency in the amount of heat, and, therefore, it is possible to prevent the problem that the unsatisfactory fixation is caused by the portion of the fixation film 1, corresponding in position to the printing junction.

That is, by laying one electrically resistant heat generating strip 1*e* upon another in the printing junction, or increasing one of the two electrically resistant heat generating strips 1*e* to be printed on the printing junction portion of the substrative layer 1*a* in the amount of heat generation, as in the first and second embodiments, it is possible to compensate for the insufficient amount of heat generation by the portion of the fixation film 1 that corresponds in position to the printing junction, and, therefore, it is possible to prevent the insufficient heating caused by the portion of the fixation film 1 that corresponds in position to the printing junction.

In the first and second embodiments described above, the rotational heating member was the fixation film 1 (member formed of heat generating film). The preceding embodiments are not intended, however to limit the present invention in scope. That is, the present invention is applicable to any rotational heating member, as long as the rotational heating member is made by forming electrically resistant heat generating strips on a cylindrical substrative layer by printing. For example, effects similar to those described above can be obtained by applying the present invention to a fixation belt, a fixation roller, and a pressure roller, that are provided with a printed heat generation layer.

Each of parts (a) and (b) of FIG. 11B is a cross-sectional view of an example of rotational heating member 1A that is in the form of a roller. These rotational heating members 1A have a metallic roller 11 as a rotational shaft, and an elastic layer 12 formed on the metallic roller 11. Further, the rotational heating members have a substrative layer 1*a* on which electrically resistant heat generating strips 1*e* and electrically conductive layers 1*b* are formed, a release layer 1*d* that is formed on the substrative layer 1*a*, and electrically resistant heat generating strips 1*e*. By the way, the present invention is also applicable to a rotational heating member structured so that the elastic layer 1*c* is placed immediately under the release layer 1*d*.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A fixing member for a fixing device, said fixing member comprising:
a cylindrical base layer; and
a plurality of heat generating resistors extending in a longitudinal direction of said fixing member on said base layer and arranged with intervals in a circumferential direction of said base layer, each of said plurality of heat generating resistors having a volume resistivity less than that of said base layer, said plurality of heat generating resistors including a first heat generating resistor and a second heat generating resistor adjacent to each other in the circumferential direction, and said first heat generating resistor and said second heat generating resistor being at least partly overlapped in the circumferential direction.

2. A fixing member according to claim 1, further comprising a first electroconductive layer and a second electroconductive layer extending in the circumferential direction at respective longitudinal end portions of said base layer, wherein longitudinal end portions of each of said plurality of heat generating resistors are electrically connected with said first electroconductive layer and said second electroconductive layer, respectively, and each of said first electroconductive layer and said second electroconductive layer has a volume resistivity less than the volume resistivity of said base layer.

3. A fixing member according to claim 1, wherein said base layer is insulative.

4. A fixing member according to claim 1, wherein said fixing member is in the form of a cylindrical film.

5. A fixing member for a fixing device, said fixing member comprising:
a cylindrical base layer; and
a plurality of heat generating resistors extending in a longitudinal direction of said fixing member on said base layer and arranged with intervals in a circumferential direction of said base layer, said plurality of heat generating resistors having volume resistivities less than that of said base layer, said plurality of heat generating resistors including a first heat generating resistor and a second heat generating resistor, an interval between said first heat generating resistor and said second heat generating resistor in the circumferential direction being the greatest of the intervals between adjacent heat generating resistors of said plurality of heat generating resistors, and a width, measured in the circumferential direction, of at least one of said first heat generating resistor and said second heat generating resistor being the greatest of the widths, measured in the circumferential direction, of said plurality of heat generating resistors.

6. A fixing member according to claim 5, further comprising a first electroconductive layer and a second electroconductive layer extending in the circumferential direction at respective longitudinal end portions of said base layer, wherein longitudinal end portions of each of said plurality of heat generating resistors is electrically connected with said first electroconductive layer and said second electroconductive layer, respectively, and each of said first electroconductive layer and said second electroconductive layer has a volume resistivity less than the volume resistivity of said base layer.

7. A fixing member according to claim 5, wherein said base layer is insulative.

8. A fixing member according to claim 5, wherein said fixing member is in the form of a film.

9. A fixing device for fixing an image on a recording material, said fixing device comprising:
(A) a rotatable heating member contactable to the image, said rotatable heating member including:
(a) a cylindrical base layer; and
(b) a plurality of heat generating resistors extending in a longitudinal direction of said fixing member on said base layer and arranged with intervals in a circumferential direction of said base layer, said plurality of heat generating resistors having volume resistivities less than that of said base layer, said plurality of heat generating resistors including a first heat generating resistor and a second heat generating resistor adjacent to each other in the circumferential direction, and said first heat generating resistor and said second heat generating resistor being at least partly overlapped in the circumferential direction; and
(B) a voltage application member configured to apply a voltage between longitudinal end portions of each of said plurality of heat generating resistors.

10. A fixing device according to claim 9, further comprising a first electroconductive layer and a second electroconductive layer extending in the circumferential direction at respective longitudinal end portions of said base layer, wherein longitudinal end portions of each of said plurality of heat generating resistors is electrically connected with said first electroconductive layer and said second electroconductive layer, respectively, and said voltage application member contacts said first electroconductive layer and said second electroconductive layer.

11. A fixing device according to claim 9, wherein said base layer this insulative.

12. A fixing device according to claim 9, wherein said rotatable heating member is in the form of a film.

13. A fixing device for fixing an image on a recording material, said fixing device comprising:
(A) a rotatable heating member contactable to the image, said rotatable heating member including:
(a) a cylindrical base layer; and
(b) a plurality of heat generating resistors extending in a longitudinal direction of said fixing member on said base layer and arranged with intervals in a circumferential direction of said base layer, said plurality of heat generating resistors having volume resistivities less than that of said base layer, said plurality of heat generating resistors including a first heat generating resistor and a second heat generating resistor, an interval between said first heat generating resistor and said second heat generating resistor in the circumferential direction being the greatest of the intervals between adjacent heat generating resistors of said plurality of heat generating resistors, and a width, measured in the circumferential direction, of at least one of said first heat generating resistor and said second heat generating resistor being the greatest of the widths, measured in the circumferential direction, of said plurality of heat generating resistors; and
(B) a voltage application member configured to apply a voltage between longitudinal end portions of each of said plurality of heat generating resistors.

14. A fixing device according to claim 13, further comprising a first electroconductive layer and a second electroconductive layer extending in the circumferential direction at respective longitudinal end portions of said base layer, wherein longitudinal end portions of each of said plurality of heat generating resistors is electrically connected with said first electroconductive layer and said second electroconductive layer, respectively, and said voltage application member contacts said first electroconductive layer and said second electroconductive layer.

15. A fixing device according to claim 13, wherein said base layer this insulative.

16. A fixing device according to claim 13, wherein said rotatable heating member is in the form of a film.

17. A method of manufacturing a fixing member for a fixing device, said method comprising:
providing a cylindrical base layer; and
printing, on said cylindrical base layer, a plurality of heat generating resistors elongated in a longitudinal direction of said fixing member with intervals in a circumferential direction of said base layer, said plurality of heat generating resistors including a first heat generating resistor first printed on said base layer and a second heat generating resistor last printed on said base layer,
said first heat generating resistor and said second heat generating resistor being printed so as to be at least partly overlapped with each other.

18. A method of manufacturing a fixing member for a fixing device, said method comprising:
providing a cylindrical base layer; and
printing, on said cylindrical base layer, a plurality of heat generating resistors elongated in a longitudinal direction of said fixing member with intervals in a circumferential direction of said base layer, said plurality of heat generating resistors including a first heat generating resistor first printed on said base layer and a second heat generating resistor last printed on said base layer, a width, measured in the circumferential direction, of at least one of said first heat generating resistor and said second heat generating resistor being the greatest of the widths, measured in the circumferential direction, of said plurality of heat generating resistors,
wherein said second heat generating resistor is printed so that an interval between said first heat generating resistor and said second heat generating resistor is the greatest of the intervals between adjacent heat generating resistors of said plurality of heat generating resistors.

* * * * *